US006667505B2

(12) United States Patent
Narimatsu et al.

(10) Patent No.: US 6,667,505 B2
(45) Date of Patent: Dec. 23, 2003

(54) SEMICONDUCTOR DEVICE HAVING A PLURALITY OF CAPACITORS ALIGNED AT REGULAR INTERVALS

(75) Inventors: Koichiro Narimatsu, Hyogo (JP); Shigeru Shiratake, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/123,165

(22) Filed: Apr. 17, 2002

(65) Prior Publication Data

US 2003/0001180 A1 Jan. 2, 2003

(30) Foreign Application Priority Data

Jun. 29, 2001 (JP) ........................................ 2001-198906

(51) Int. Cl.[7] .................. H01L 27/108; H01L 29/76; H01L 29/94; H01L 31/119
(52) U.S. Cl. .................. 257/303; 257/304; 257/305; 257/306; 257/309
(58) Field of Search ................ 257/296, 303, 257/304, 305, 306, 307, 308, 309, 907, 908

(56) References Cited

U.S. PATENT DOCUMENTS 5,610,418 A * 3/1997 Eimori ........................ 257/306

FOREIGN PATENT DOCUMENTS

| JP | 2000-31426 | 1/2000 |
| JP | 2000-150824 | 5/2000 |
| JP | 2000-252437 | 9/2000 |

* cited by examiner

*Primary Examiner*—Thien Tran
(74) *Attorney, Agent, or Firm*—McDermott, Will & Emery

(57) ABSTRACT

A semiconductor device includes a capacitor formed to have an approximately elliptical cross-sectional shape and extending upwards from upper surface of each said storage node contact. When an arrangement of capacitors is seen vertically from above, rows of capacitors are formed such that, along direction of a major axis of the approximate ellipse, a plurality of capacitors are aligned with regular intervals. When arbitrary one of said capacitor rows is taken as a first capacitor row, a second capacitor row is arranged in parallel therewith, and the capacitors in the first capacitor row and the second capacitor row are aligned out of phase with each other by length corresponding approximately to a sum of width of one transfer gate and width of one space between transfer gates.

6 Claims, 14 Drawing Sheets

SEMICONDUCTOR DEVICE HAVING A PLURALITY OF CAPACITORS ALIGNED AT REGULAR INTERVALS

BACKGROUND OF THE INVENTION

1. Field of the Invention

The present invention relates to a semiconductor device and manufacturing method thereof. More particularly, the present invention relates to an arrangement of capacitors formed above transfer gate in memory cell portion.

2. Description of the Background Art

Conventional semiconductor device is described with reference to FIGS. 11 to 14. FIG. 11 is a plan view of memory cell portion of the semiconductor device. In order to explain relative position of each portion, the drawing assumes that all interlayer insulating layers actually filling spaces between each portion are transparent. FIG. 12 shows a cross-sectional view cut along a centerline of bit line 6 shown in FIG. 11, i.e., a cross-section with respect to the line XII—XII viewed in the direction of arrows. FIG. 13 shows a cross-sectional view cut along a centerline of capacitor 14 shown in FIG. 11, i.e., a cross-section with respect to the line XIII—XIII viewed in the direction of arrows. A plurality of transfer gates 2 are formed linearly and in parallel with each other such that they protrude above the main surface of semiconductor substrate 1 such as silicon wafer. Within a space between these transfer gates 2, a lower layer contact 4a each made of conductive material is formed such that it is connected to each bit line 6 with a regular spacing, to have a shape of approximate ellipse whose major axis is parallel to longitudinal direction of said transfer gate 2. As shown in FIG. 12, lower layer contact 4a is electrically connected to main surface of semiconductor substrate 1. Upper side of transfer gate 2 is covered with an interlayer insulating layer 3.

As shown in FIG. 12, a bit line contact 7 is electrically connected from above lower layer contact 4a. Bit line contact 7 is for electrically connecting bit line 6 of conductive material extending horizontally over transfer gate 2 with lower layer contact 4a. The section over lower layer contact 4a and under bit line 6 is filled with interlayer insulating layer 5. The section over bit line 6 is filled with interlayer insulating layer 8.

As shown in FIG. 13, a plurality of capacitors 14 arranged over transfer gate 2 are so-called concave type capacitors. These are cup-type condensers each having a bottom surface on its lower end, and its upper ends open. When cut along a horizontal plane, their cross-sectional shape look like two semicircles opposing to each other with a short distance, joined by parallel sides as shown in FIG. 11. Along this cup-type form, two conductive material parts called storage node 11 and cell plate cylindrical portion 12 contact with an insulating layer (not shown) interposed, forming a condenser. Storage node 11 covers outer side of the cup-type form, and is electrically connected to lower layer contact 4b formed inside the space between transfer gates 2 by storage node contact 9. Therefore, there are two kinds of lower layer contact: lower layer contact 4a connecting bit line contact 7, and lower layer contact 4b connecting storage node contact 9. The section over storage node contact 9 where capacitor 14 does not exist is filled with interlayer insulating layer 10. Upper surface of interlayer insulating layer 10 is covered with cell plate upper surface portion 13 which is of a conductive material. Cell plate upper surface portion 13 is connected to cell plate cylindrical portion 12. Cell plate upper surface portion 13 and storage node 11 are insulated by intermediate insulating layer (not shown) interposed therebetween.

This capacitor 14 is a condenser which is desired to have larger capacity. If it has constant thickness (distance from top to bottom in FIG. 13), it is desirable to enlarge cross-sectional shape of capacitor 14 to obtain larger capacity. In addition, in the case of concave type capacitor, when the aspect ratio as a value of its depth divided by width becomes too large, problem such as defective embedding of electrode material within capacitor 14 or degradation of etching shape may occur. From this aspect, it is also desired to enlarge the cross-sectional shape.

As shown in FIG. 11, conventional capacitors 14 are each arranged directly above each storage node contact 9 with its center corresponding to the center of storage node contact 9; as the result, capacitors are aligned in square. FIG. 14 extracts and shows only this arrangement of capacitors 14.

Enlargement of cross-sectional shape of capacitor 14 will be described referring to dimensions a, b, c, and d shown in FIG. 14. When enlarging the size of individual capacitor 14 with the arrangement of capacitors 14 themselves kept as it is, it is theoretically possible to enlarge two parameters a and b respectively. Processing of capacitor 14 will be difficult, however, if only a becomes longer and the ratio a/b becomes extremely large. Therefore, both a and b must be enlarged together to enlarge the shape of capacitor 14.

On the other hand, thickness of interlayer insulating layer 10 which separates neighboring capacitors 14 must be larger than a prescribed value to avoid neighboring capacitors 14 effecting each other as condensers. When a and b are enlarged together, d rather than c will become the first problem for the thickness of interlayer insulating layer 10. Since the distance d must have at least a prescribed value, enlargement of a is limited so that there is a dead space 15 in the area surrounded by four capacitors 14 as shown in FIG. 11.

Therefore, an object of the present invention is to provide a semiconductor device which can minimize dead space in the arrangement of capacitors and maximize shape of individual capacitor, and a method of manufacturing the semiconductor device.

SUMMARY OF THE INVENTION

To accomplish the above-mentioned object, the semiconductor device according to the present invention includes a semiconductor substrate having a main surface, a plurality of transfer gates formed on the main surface and extending linearly in parallel with each other, lower layer contacts each formed of a conductive material, so as to electrically connect to the main surface in a plurality of spaces respectively formed between the plurality of transfer gates, a plurality of storage node contacts each formed of rod-shaped conductive material extending upwards, and arranged with electrical connection to upper surface of selected ones of the lower layer contacts, and a capacitor formed to have an approximately elliptical cross-sectional shape whose major axis is perpendicular to longitudinal direction of the transfer gate and extending upwards from upper surface of each storage node contact, wherein when the arrangement of the capacitors is seen vertically from above the main surface, rows of capacitors are formed such that, along direction of the major axis, the plurality of capacitors are aligned with regular intervals with a pitch therebetween corresponding approximately two times the sum of width of one transfer gate and width of one space between transfer gates, and when arbitrary one of the capacitor rows is taken as a first capacitor row, a second capacitor row which is another capacitor row is arranged adjacent to and in parallel therewith, and capacitors in the first capacitor row and the second capacitor row are aligned out of phase with each other by the length corresponding approximately to the sum of width of one transfer gate and width of one space between the transfer gates. In this structure, arrangement of capacitors would not be a simple square-shape, and since neighboring capacitor rows are made out of phase with each other by a certain amount, ellipse of individual capacitor can further be enlarged without interfering with ellipse of each capacitor belonging to the neighboring capacitor row.

In the invention above, preferably, when the storage node contacts aligned with electrical connection to upper surface of each of the lower layer contacts aligned in one arbitrary space between the transfer gates is looked from above, the capacitors overlap with centers of the approximate ellipses shifted alternately in opposite sides. By this structure, even if arrangement of storage node contacts has the conventional square shape, new capacitor arrangement based on the present invention described above can be provided thereabove, thereby ensuring connection to storage node contact of each capacitor effectively and reliably.

In the invention above, preferably, when arbitrary one of the capacitors is taken as a specific capacitor, among other surrounding capacitors, the capacitor diagonally adjacent to it in the direction of the major axis is the closest to above-mentioned specific capacitor. By this structure, wasteful space of the capacitor arrangement can be made as small as possible.

In the invention above, preferably the semiconductor device includes a plurality of bit lines arranged in parallel with each other and extending perpendicular to the transfer gate in a plane positioned above upper end of the transfer gate and below lower end of the capacitor, and electrically connected to selected lower layer contacts via bit line contacts extending downward from the bit lines. By this structure, since the bit lines are arranged below the capacitors, the difficulty in arranging bit line contacts due to the arrangement of capacitors can be avoided.

In the invention above, preferably the capacitor includes a storage node and a cell plate, wherein the storage node is a conductor electrically connected to the storage node contact, having a cross-sectional shape of approximate ellipse and formed as container type having a bottom surface on the lower end and open upper end, while the cell plate is a conductor covering inner surface of the storage node with insulating layer posed therebetween. By this structure, cross-sectional area of each capacitor can be enlarged to make a concave type capacitor with reduced embedding defect or etching shape defect.

In the invention above, preferably the capacitor includes a storage node and a cell plate, wherein the storage node is a conductor electrically connected to the storage node contact and is formed in solid, approximate elliptic cylinder form, and the cell plate is a conductor covering outer surface of the storage node with insulating layer posed therebetween. By this structure, since each capacitor has an ellipse shape which can be enlarged sufficiently in the direction of its minor axis, the space between capacitors in the direction of major axis can have sufficient margin and the capacitor can be made as a convex type capacitor with reduced probability of short circuit resulting, for example, from intervening microscopic foreign matters between capacitors.

To accomplish the above-mentioned object, the method of the present invention is a method of manufacturing a semiconductor device which includes a semiconductor substrate having a main surface, a plurality of transfer gates formed on the main surface and extending linearly in parallel with each other, lower layer contacts each formed of a conductive material, so as to electrically connect to the main surface in a plurality of spaces respectively formed between the plurality of transfer gates, a plurality of storage node contacts each formed of rod-shaped conductive material extending upwards, and arranged with electrical connection to upper surface of selected ones of the lower layer contacts, and a capacitor formed to have an approximately elliptical cross-sectional shape whose major axis is perpendicular to longitudinal direction of the transfer gate and extending upwards from upper surface of each storage node contact, wherein, in order to form the capacitor, the method comprises a platemaking step of performing platemaking for resist applied on upper surface to form resist pattern using platemaking mask pattern, and an etching step of etching with the resist pattern obtained from the platemaking step, wherein arrangement of the platemaking mask pattern is such that, along direction of the major axis, the plurality of capacitors are aligned with regular intervals with a space therebetween being approximately the width of one transfer gate, forming capacitor rows, and when arbitrary one of the capacitor rows is taken as first capacitor row, a second capacitor row which is another capacitor row is arranged adjacent to and in parallel therewith, and capacitors in the first capacitor row and the second capacitor row are aligned out of phase with each other by the length corresponding approximately to the sum of width of one transfer gate and width of one space between the transfer gates. By this method, the semiconductor device can be obtained of which capacitor has not a simple square-shape but an arrangement in which neighboring capacitor rows are made out of phase with each other by a prescribed amount. Thus, semiconductor device having capacitors with enlarged cross-sectional shape can be obtained.

In the invention above, as above-mentioned platemaking mask pattern, it is preferable to use the platemaking mask pattern having cross pattern at portions where approximate ellipse pattern should be formed. By this method, platemaking mask pattern for forming approximate ellipse shape capacitor can be provided only with straight lines, even if it is impossible to make platemaking mask pattern of curved figure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
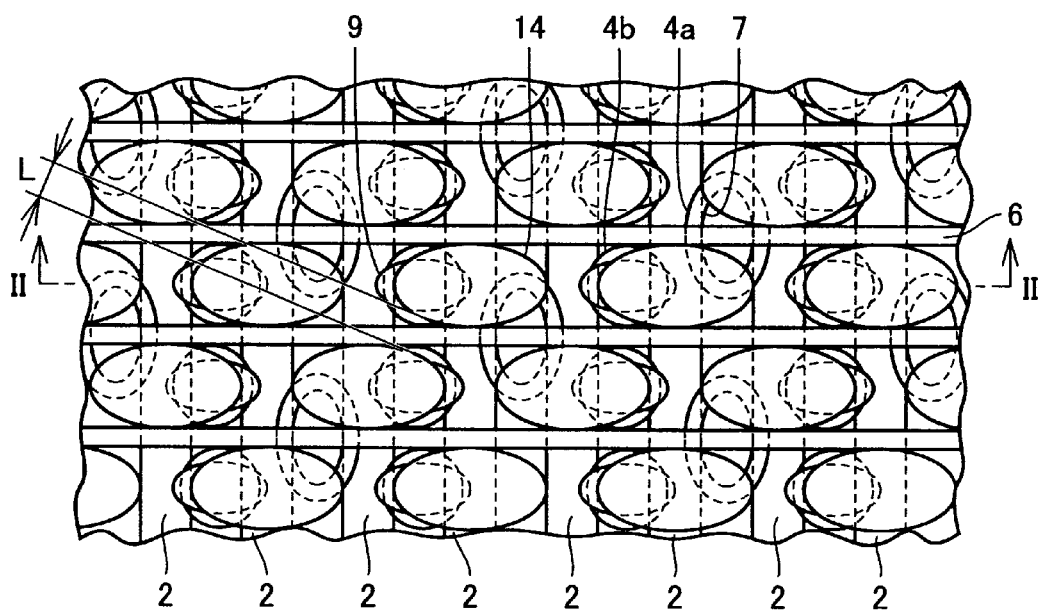
FIG. 1 is a plan view of memory cell portion of semiconductor device in a first embodiment according to the present invention.
Figure 2:
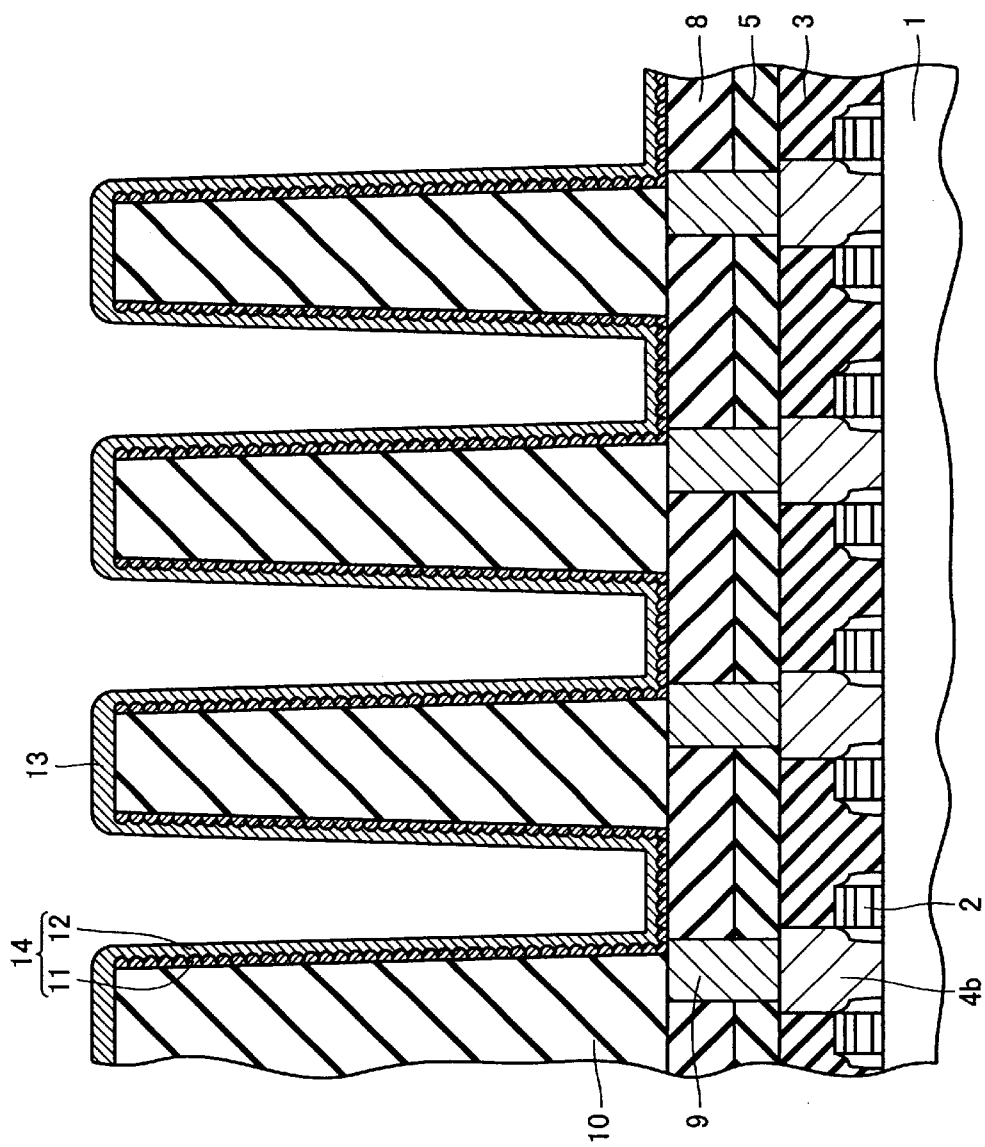
FIG. 2 is a cross-section with respect to line II—II viewed in the direction of arrows shown in FIG. 1.
Figure 12:
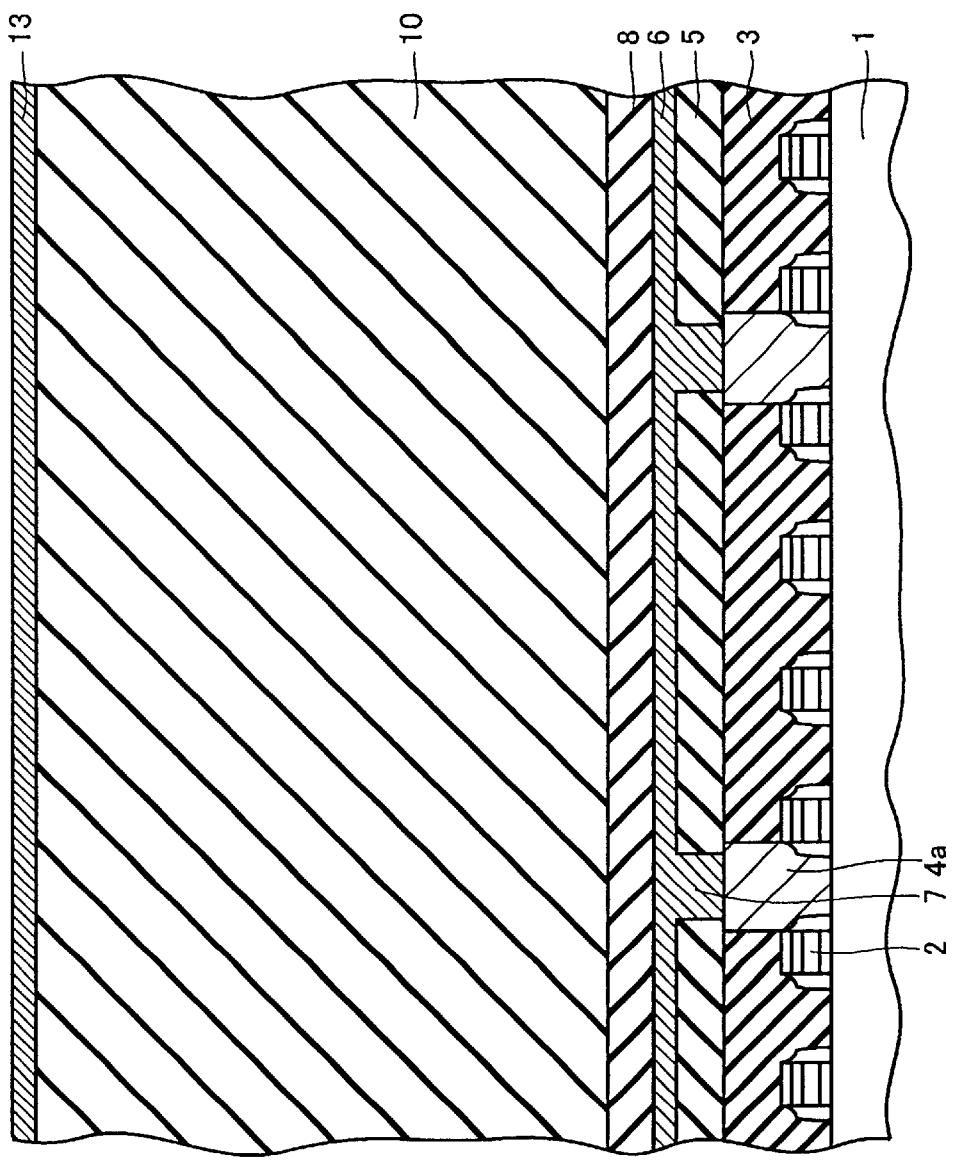
FIG. 12 is a cross-section with respect to line XII—XII viewed in the direction of arrows shown in FIG. 11.
Figure 13:
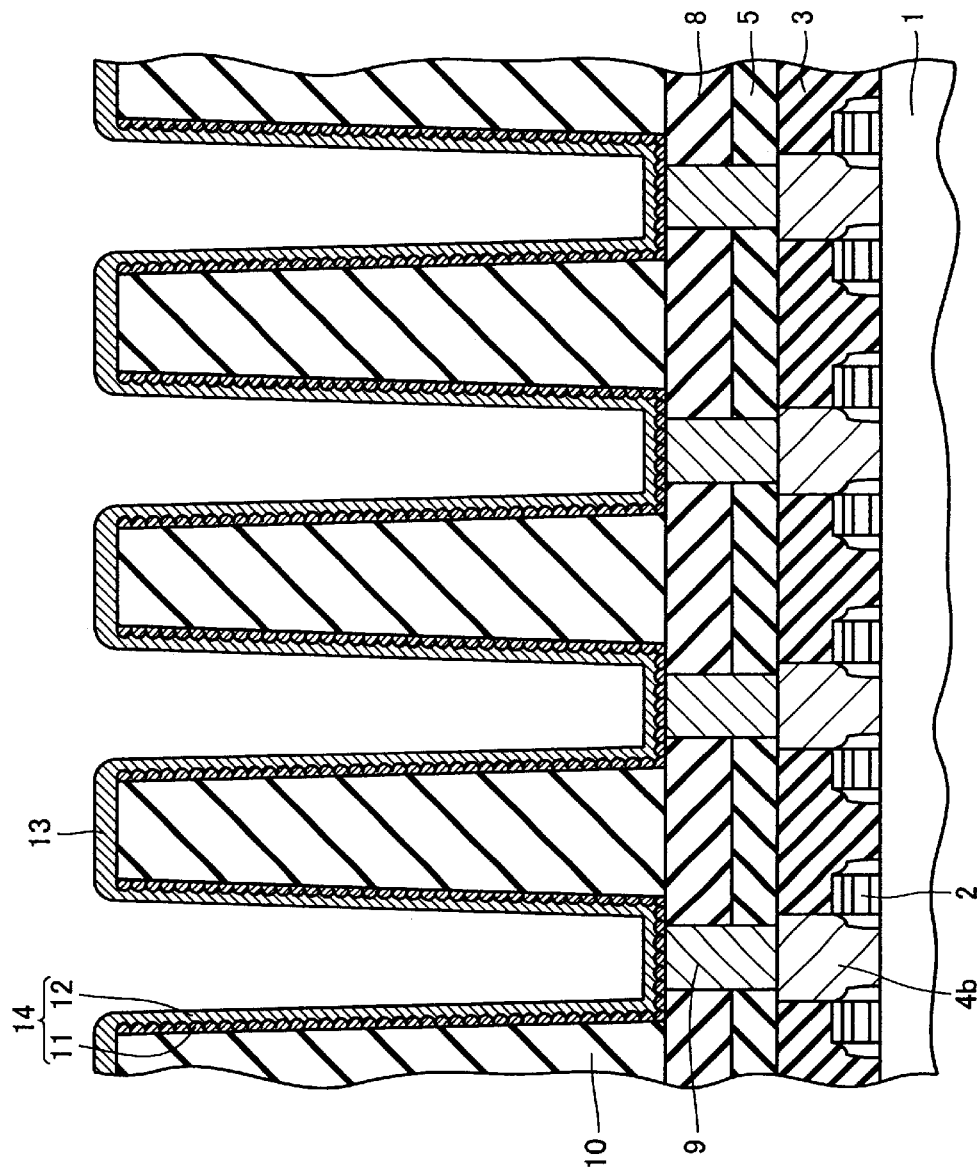
FIG. 13 is a cross-section with respect to line XIII—XIII viewed in the direction of arrows shown in FIG. 11.
Figure 14:
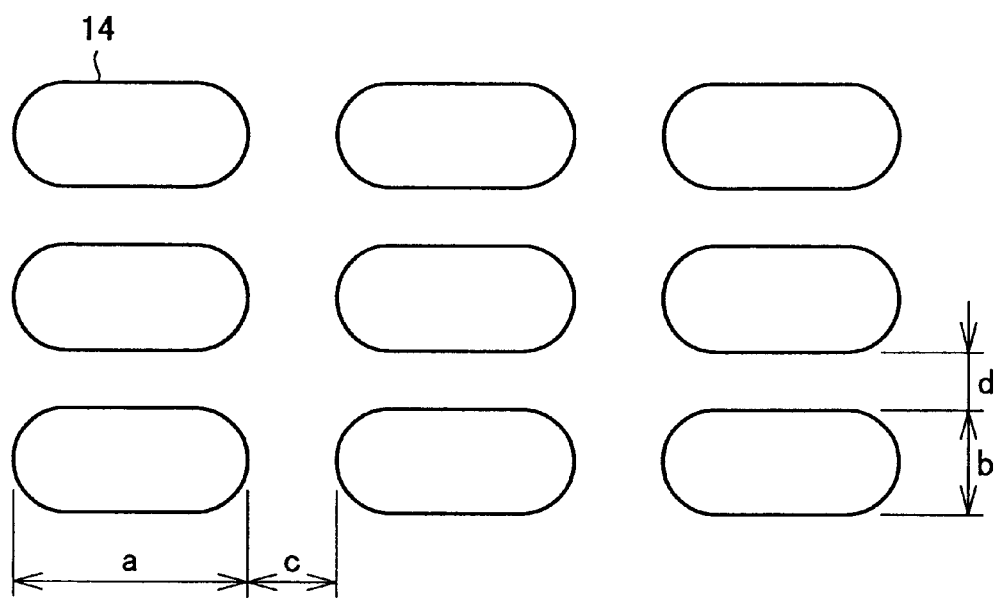
FIG. 14 represents an arrangement of capacitors of semiconductor device according to the prior art.

Referring to FIGS. 1 and 2, a semiconductor device in the first embodiment according to the present invention will be described. FIG. 1 is a plan view of memory cell portion of the semiconductor device. In order to describe relative position of each portion, the drawing assumes that all interlayer insulating layers actually filling spaces between each portion are transparent. FIG. 2 shows a cross-section when cut along a centerline of capacitor 14 shown in FIG. 1, i.e., a cross-section with respect to the line II—II viewed in the direction of arrows. Structures of semiconductor substrate 1, transfer gate 2, interlayer insulating layers 3, 5 and 8, lower layer contact 4b, and storage node contact 9 are similar to those of corresponding parts of the prior art semiconductor device described referring to FIG. 13. Cross-sectional view cut along a centerline of bit line 6 shown in FIG. 1 is similar to that shown in FIG. 12 and therefore the description will not be repeated here.

Since individual capacitor 14 is a concave type capacitor and the structure is also similar to that of prior art semiconductor device described above, the description will not be repeated here. Storage node 11 is also electrically connected to lower layer contact 4b by storage node contact 9.

Figure 11:
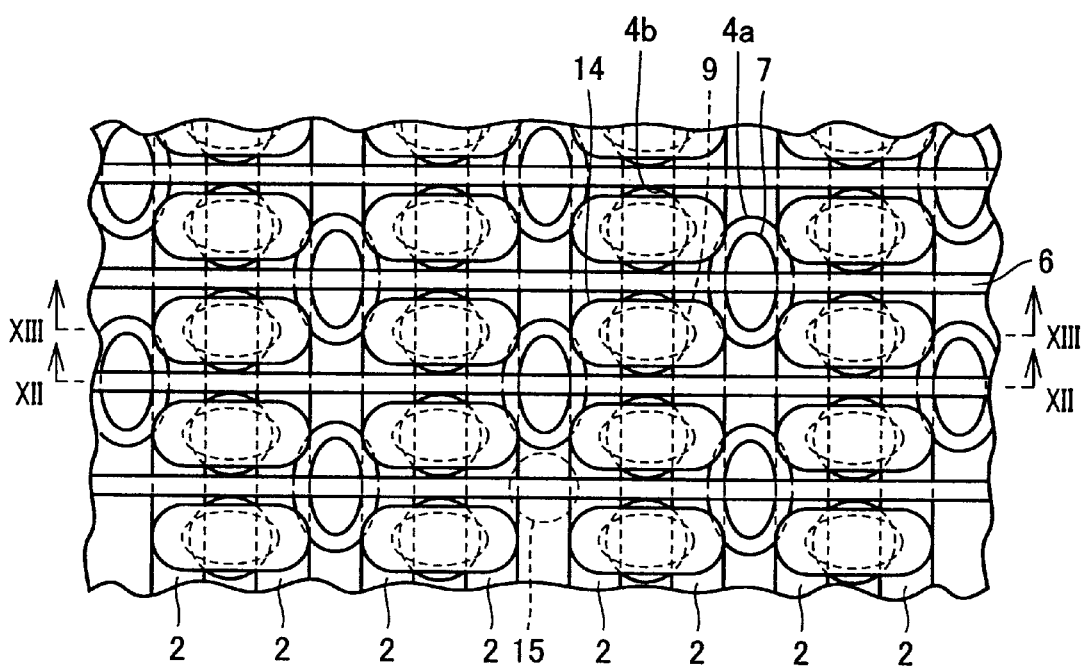
FIG. 11 is a plan view of memory cell portion of semiconductor according to prior art.

As will be clear by comparison between FIG. 1 and FIG. 11, this semiconductor device is different from the conventional semiconductor device with respect to cross-sectional shape of individual capacitor 14 or relative position of capacitor 14 and storage node contact 9.

In the semiconductor device of this embodiment, cross-sectional shape of capacitor 14 is an approximate ellipse rather than the shape shown in FIG. 11. Major axis of the approximate ellipse is perpendicular to longitudinal direction of transfer gate 2.

In addition, the arrangement of capacitors 14 in this semiconductor device is such that, along the direction of major axis of approximate ellipse (left-to-right direction in FIG. 1), a plurality of capacitors 14 are aligned with regular intervals with a pitch therebetween corresponding approximately two times the sum of width of one transfer gate 2 and width of one space between transfer gates, forming capacitor rows. When arbitrary one of the capacitor rows is taken as a first capacitor row, a second capacitor row which is another capacitor row is arranged adjacent to and in parallel therewith, and capacitors 14 in the first capacitor row and the second capacitor row are aligned out of phase with each other by the length corresponding approximately to the sum of width of one transfer gate 2 and width of one space between the transfer gates 2. Though arrangement of capacitors 14 is as such, arrangement of storage node contacts 9 is the same as conventional one. As the result, center of storage node contact 9 and center of capacitor 14 are shifted from each other in the direction of major axis of approximate ellipse as shown in FIGS. 1 and 2. Furthermore, the manner of shifting is such that, when looking at each capacitor row one after another along longitudinal direction of transfer gate 2 (up-to-down direction in FIG. 1), centers of capacitors 14 are shifted in opposite directions on alternate rows.

Thus, when storage node contact 9 aligned with electrical connection to upper surface of each lower layer contact 4b aligned in one arbitrary space between transfer gates 2 is looked from above, we can say that capacitors 14 overlap with centers of the approximate ellipses shifting alternately in opposite sides.

Figure 3:
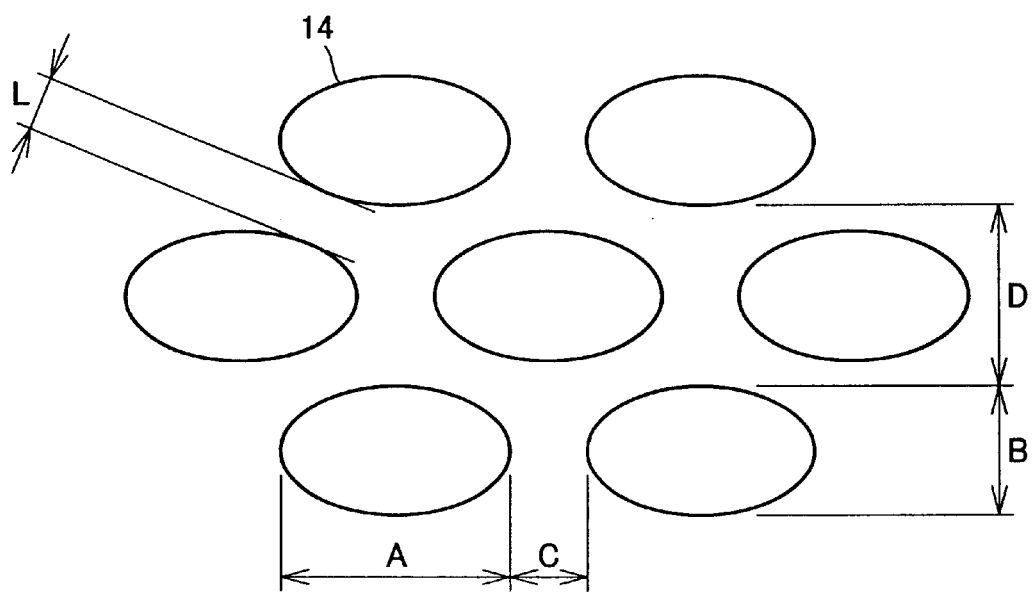
FIG. 3 represents arrangement of capacitors of semiconductor device in the first embodiment according to the present invention.

FIG. 3 extracts and shows only the arrangement of capacitors 14 in FIG. 1. Since capacitors 14 have approximate ellipse shape as described above and form the arrangement in which they are shifted on alternate rows as described above, when arbitrary one of the capacitors is taken as a specific capacitor, among other surrounding capacitors, the capacitor diagonally adjacent to it in the direction of the major axis can be the closest to above-mentioned specific capacitor. That is, distance L in FIG. 3 will be shorter than C or D.

Since arrangement of capacitors 14 does not have a simple square shape but is shifted on alternate rows as described above, when the ellipse is to be enlarged, minor axis of the ellipse will be prolonged just towards the space between capacitors in adjacent capacitor rows, even if major axis and minor axis are prolonged simultaneously. Therefore, minor axis can be prolonged to ensure the large ellipse shape. According to this arrangement, capacitor with larger cross-sectional shape compared to conventional one can be obtained, since only the distance between diagonally adjacent capacitors, i.e., distance L in FIG. 3, should be kept equal to or above the minimum thickness of interlayer insulating layer necessary between capacitors. In addition, dead space can be made smaller than that of the conventional device.

It should be noted that the relation of arrangement between capacitors and bit lines is generally based on COB (Capacitor On Bit-Line) system or CUB (Capacitor Under Bit-Line) system. In the semiconductor device in this embodiment, the COB system in which capacitor 14 is stacked above bit line 6 is taken. In contrast, in case of CUB system in which bit line is stacked above capacitor, bit line contact for connecting bit line to lower layer contact had to connect to lower layer contact through space between capacitors. In case of capacitors arranged in square as conventional, to design bit line contact to go through the space between capacitors in the CUB system was easy, since the space was relatively wide. In the semiconductor device of this embodiment, however, space between capacitors becomes narrower so that it would be disadvantageous to take the CUB system. In contrast, such a problem does not occur and arrangement of capacitors can be determined in the COB system. Therefore, it is more preferable to apply the present invention to the COB system.

Second Embodiment

Figure 4:
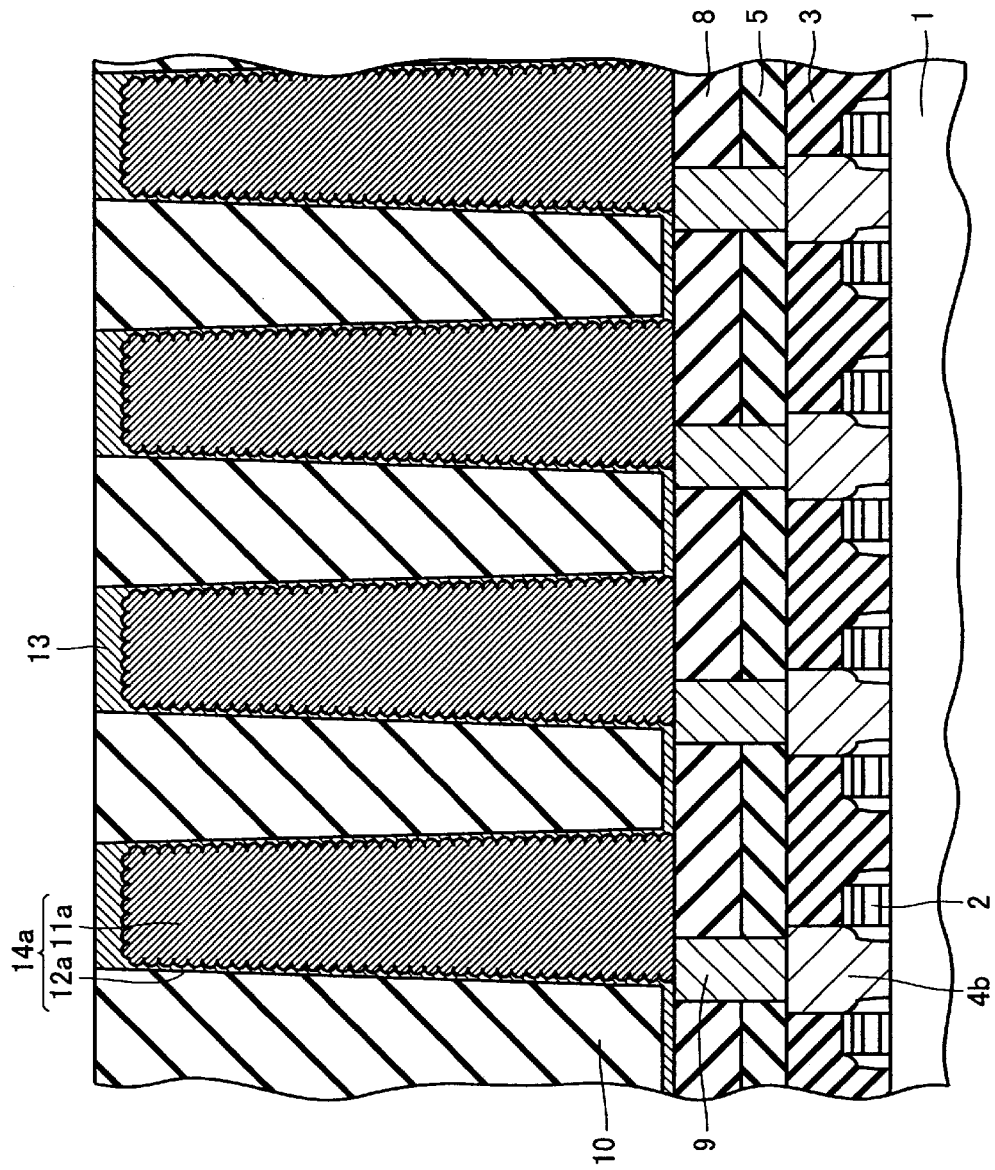
FIG. 4 is a cross-section of memory cell portion of semiconductor device in a second embodiment according to the present invention.

A semiconductor device in the second embodiment according to the present invention will be described. In semiconductor device in the first embodiment, capacitor 14 was a concave type capacitor. In contrast, in semiconductor device in this embodiment, capacitor 14a is a convex type capacitor. The plan view is similar to that shown in FIG. 1. FIG. 4 shows cross-sectional view cut along the plane corresponding to FIG. 2. Capacitor 14a has approximately elliptical cross-sectional shape when cut along a horizontal plane, and has solid, approximately elliptical cylinder form. Inside thereof is filled with conductive material, providing a storage node 11a. For storage node 11a, cell plate cylindrical portion 12a covers its outer surface with an insulating layer (not shown) therebetween. Storage node 11a and cell plate cylindrical portion 12a opposing as such with insulating layer interposed provides a condenser. Cell plate cylindrical portion 12a is connected to cell plate upper surface portion 13. Storage node 11a is electrically connected with storage node contact 9. Cell plate cylindrical portion 12a and storage node contact 9 are insulated from each other.

It should be noted that, all of the elements are similar to that of the first embodiment except for the convex type capacitor substituted for concave type capacitor.

In this embodiment, similar effect as the first embodiment can also be obtained.

Third Embodiment

Figure 5:
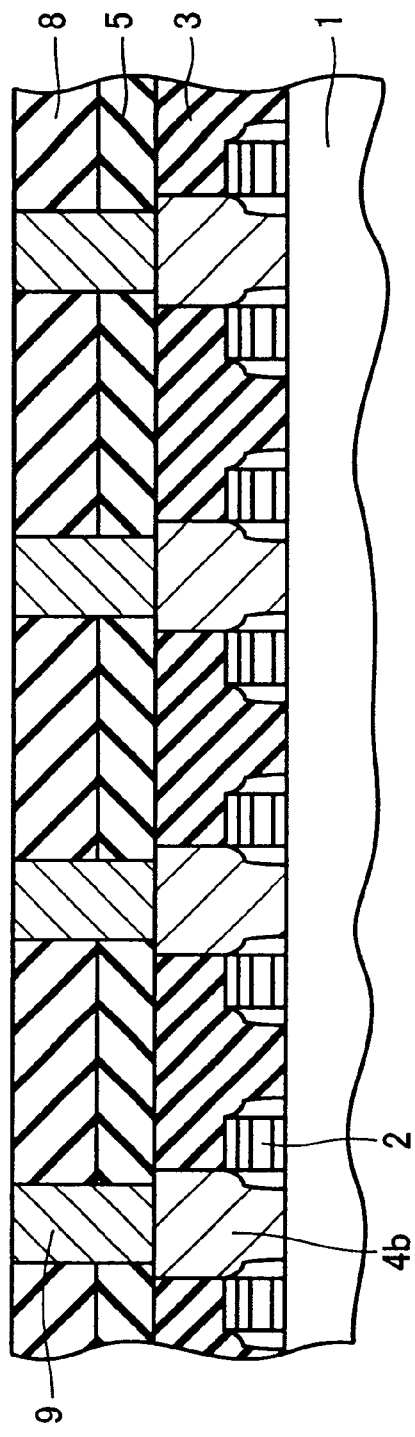
FIG. 5 represents a first step of a method of manufacturing semiconductor device in a third embodiment according to the present invention.
Figure 6:
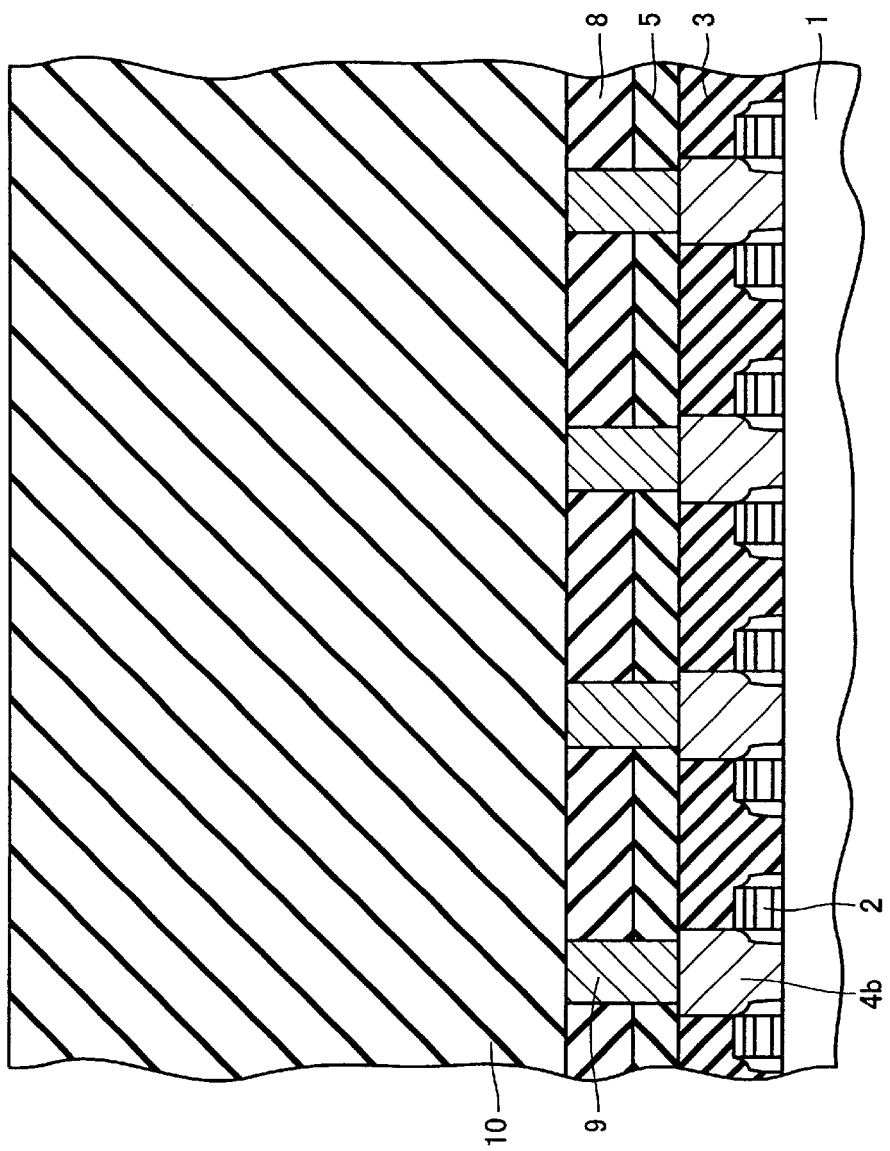
FIG. 6 represents a second step of the method of manufacturing semiconductor device in the third embodiment according to the present invention.
Figure 7:
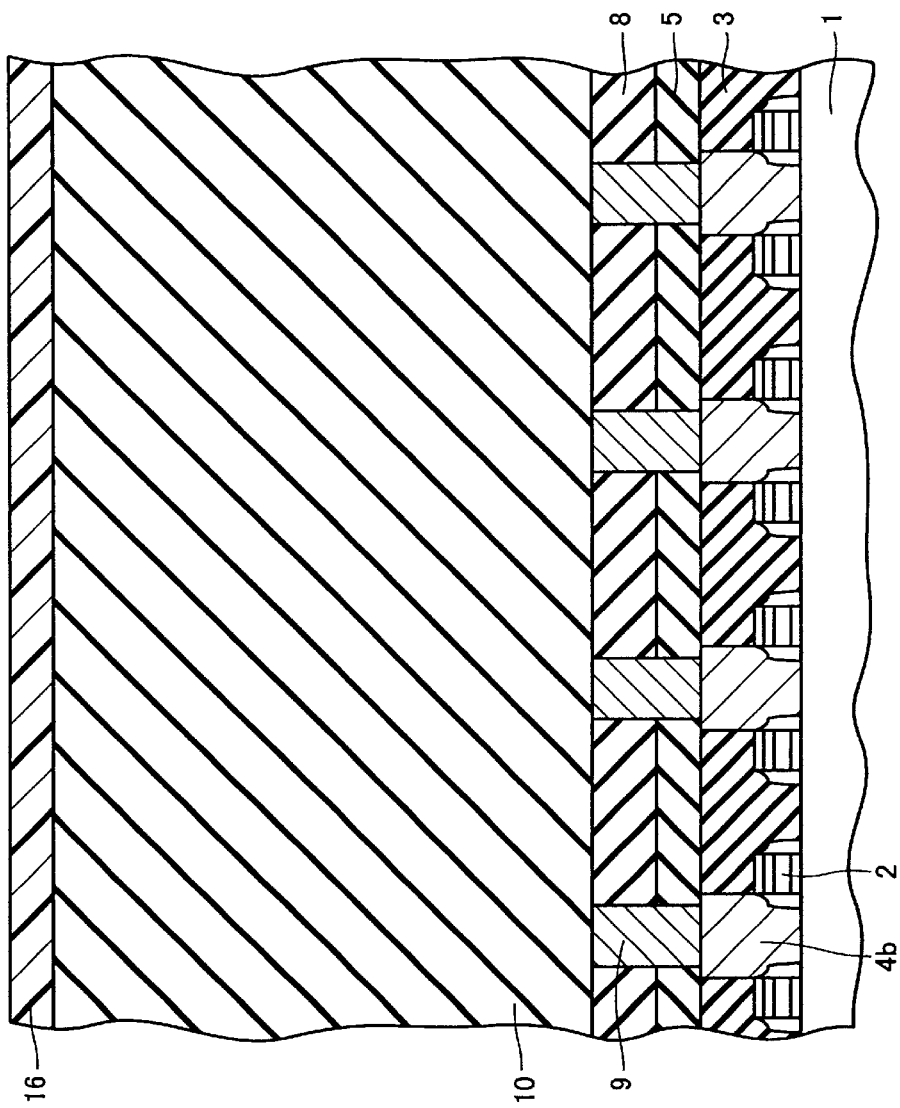
FIG. 7 represents a third step of the method of manufacturing semiconductor device in the third embodiment according to the present invention.
Figure 8:
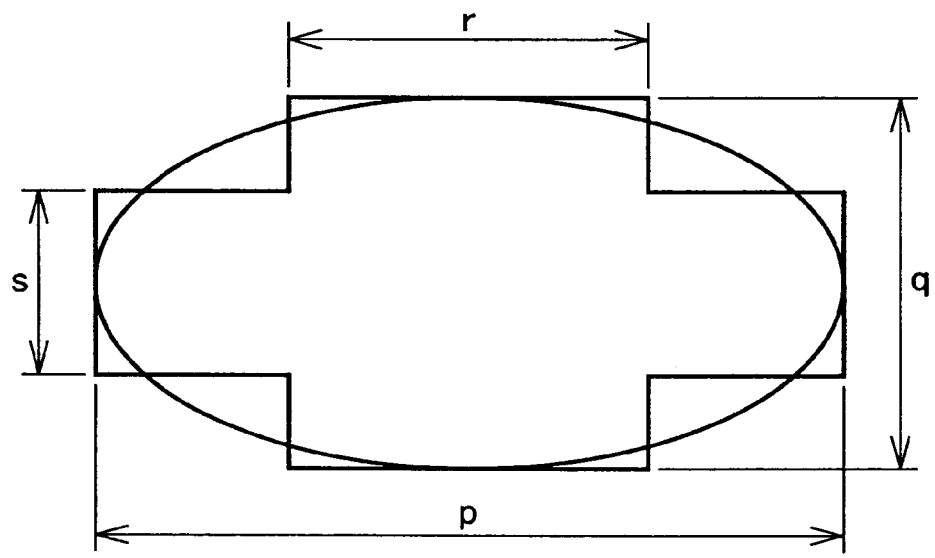
FIG. 8 represents platemaking mask pattern used in the method of manufacturing semiconductor device in the third embodiment according to the present invention.
Figure 9:
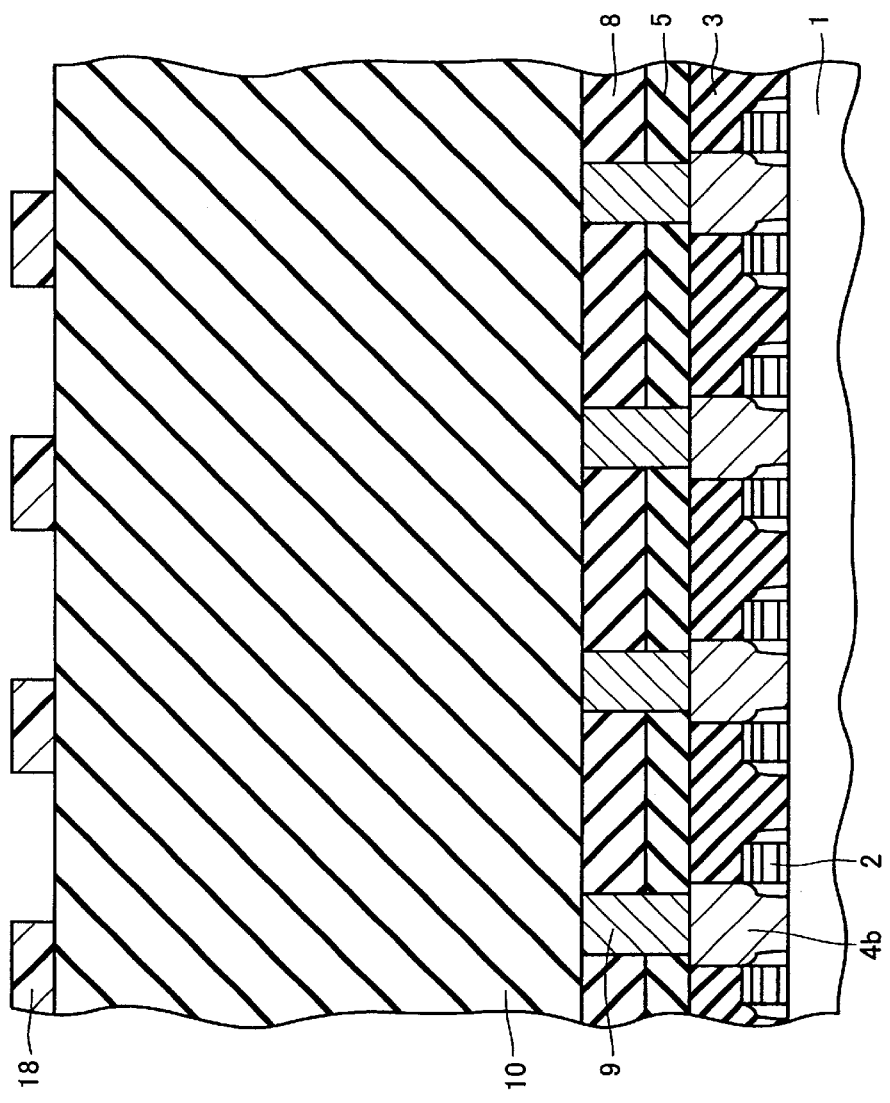
FIG. 9 represents a fourth step of the method of manufacturing semiconductor device in the third embodiment according to the present invention.
Figure 10:
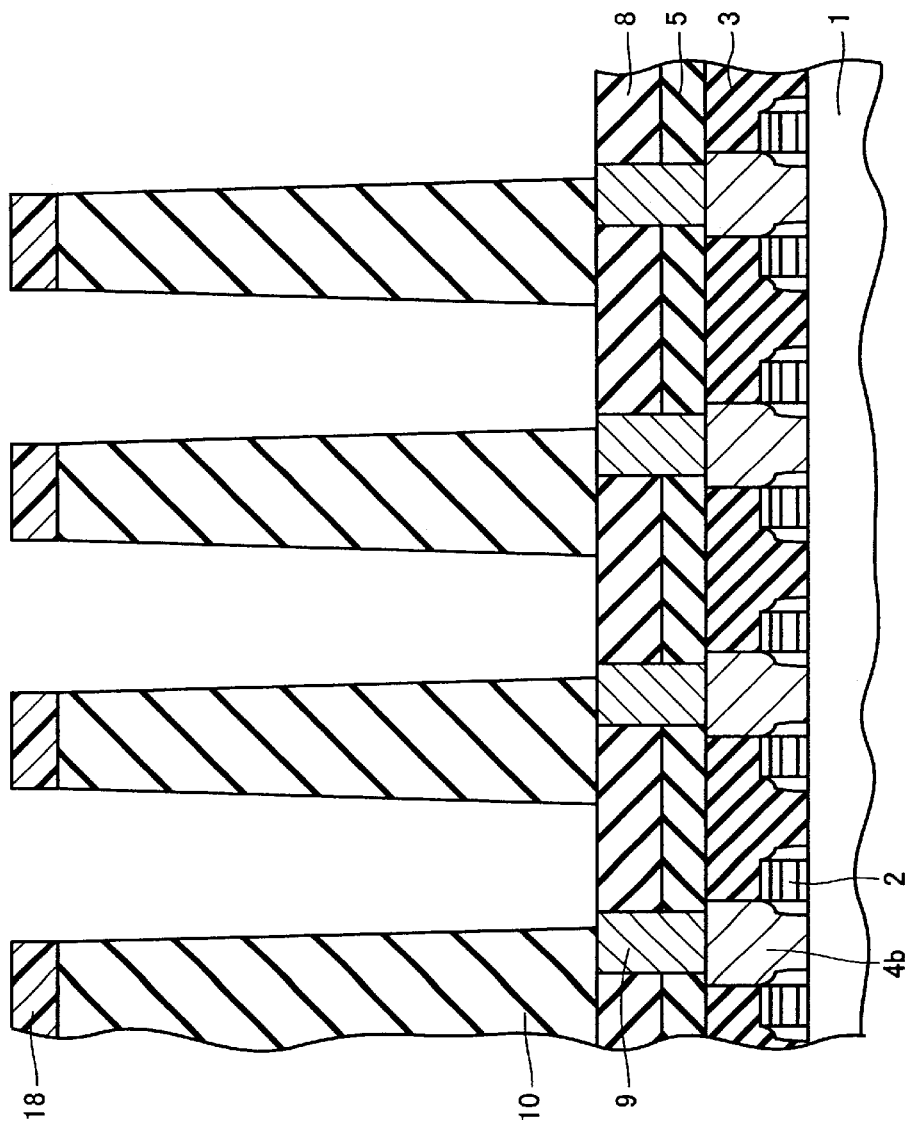
FIG. 10 represents a fifth step of the method of manufacturing semiconductor device in the third embodiment according to the present invention.

A method of manufacturing semiconductor device in the third embodiment according to the present invention will be described. This method is the method of manufacturing the semiconductor device described in the first embodiment. First, the structure shown in FIG. 5 is formed with known technique. Then interlayer insulating layer 10 is stacked on an upper surface to obtain the structure shown in FIG. 6. As shown in FIG. 7, a resist 16 is applied on the whole upper surface, and photomechanical step is performed using platemaking mask pattern. In this example, platemaking mask pattern of arranged pattern of ellipse shape as shown in FIG. 3 is used. In case that it is difficult to make ellipse shape corresponding to individual capacitor as platemaking mask pattern, the pattern may include cross shape as shown in FIG. 8 instead of ellipse shape. To set this cross shape, each parameter p, q, r, and s is set after optimization as appropriate by simulation, for example. Platemaking is performed using such a platemaking mask pattern, and resist pattern 18 is formed from resist 16. This state is shown in FIG. 9. Etching of interlayer insulating layer 10 is performed using resist pattern 18 as a mask, and resulting state is shown in FIG. 10. Resist pattern 18 is removed thereafter, and then storage node 11, insulating layer and cell plate cylindrical portion 12 are stacked sequentially inside the concave portion of interlayer insulating layer 10 to complete capacitor 14, and thereby semiconductor device shown in FIG. 2 can be obtained.

As described above, in comparison with manufacturing of conventional semiconductor device, the semiconductor device described in the first embodiment according to the present invention can be manufactured simply by using a substituted platemaking mask pattern. In addition, though cross-sectional shape of individual capacitor is aimed to be approximate ellipse shape, the shape provided to platemaking mask pattern is not necessarily ellipse; even if the shape is cross, resist pattern of approximate ellipse can actually be formed by blur of exposure during photomechanical step. Therefore, platemaking mask pattern can be constructed only with straight lines where it is impossible to make platemaking mask pattern of curved figure.

According to the present invention, arrangement of capacitors would not be a simple square-shape, and since neighboring capacitor rows are made out of phase with each other by a certain amount, ellipse of individual capacitor can further be enlarged without interfering with ellipse of each capacitor belonging to the neighboring capacitor row.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

a plurality of transfer gates formed on said main surface and extending linearly in parallel with each other;

lower layer contacts, each formed of a conductive material, so as to electrically connect to said main surface in a plurality of spaces respectively formed between said plurality of transfer gates;

a plurality of storage node contacts, each formed of rod-shaped conductive material extending upwards, arranged with electrical connection to upper surface of selected ones of said lower layer contacts; and a plurality of capacitors formed to have an approximately elliptical cross-sectional shape whose major axis is perpendicular to longitudinal direction of said transfer gates and extending upwards from upper surface of each said storage node contact; wherein when an arrangement of said capacitors is seen vertically from above said main surface, rows of capacitors are formed such that, along direction of said major axis, a plurality of said capacitors are aligned with regular intervals with a pitch therebetween corresponding approximately two times the sum of width of one said transfer gate and width of one space between said transfer gates, and when arbitrary one of said capacitor rows is taken as a first capacitor row, a second capacitor row which is another said capacitor row is arranged adjacent to and in parallel therewith, and said capacitors in said first capacitor row and said second capacitor row are aligned out of phase with each other by length corresponding approximately to a sum of width of one said transfer gate and width of one space between said transfer gates.

2. The semiconductor device according to claim 1, wherein when said storage node contacts aligned with electrical connection to upper surface of each of said lower layer contacts aligned in one arbitrary space between said transfer gates is looked from above, said capacitors overlap said storage node contacts with centers of said capacitors shifted alternately in opposite sides.

3. The semiconductor device according to claim 1, wherein when an arbitrary one of said capacitors is taken as a specific capacitor, among other surrounding said capacitors, a capacitor diagonally adjacent to said specific capacitor in a direction of said major axis is the closest to said specific capacitor.

4. The semiconductor device according to claim 1, comprising a plurality of bit lines arranged in parallel with each other and extending perpendicular to said transfer gates in a plane positioned above an upper end of said transfer gates and below a lower end of said capacitors, and electrically connected to selected ones of said lower layer contacts via bit line contacts extending downward from said bit lines.

5. The semiconductor device according to claim 1, wherein said capacitors each comprise a storage node and a cell plate; said storage node is a conductor electrically connected to a storage node contact, having a cross-sectional shape of approximate ellipse and formed as container type having a bottom surface on lower end and open upper end; and said cell plate is a conductor covering inner surface of said storage node with insulating layer posed therebetween.

6. The semiconductor device according to claim 1, wherein said capacitors each comprise a storage node and a cell plate; said storage node is a conductor electrically connected to a storage node contact and is formed in solid, approximate elliptic cylinder form; and said cell plate is a conductor covering outer surface of said storage node with insulating layer posed therebetween.

\* \* \* \* \*

UNITED STATES PATENT AND TRADEMARK OFFICE
CERTIFICATE OF CORRECTION

PATENT NO. : 6,667,505 B2
DATED : December 23, 2003
INVENTOR(S) : Koichiro Narimatsu et al.

It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology, Corp. --.

Signed and Sealed this

Twenty-sixth Day of July, 2005

JON W. DUDAS
*Director of the United States Patent and Trademark Office*